United States Patent
Jung et al.

(10) Patent No.: US 12,432,996 B2
(45) Date of Patent: Sep. 30, 2025

(54) POWER SEMICONDUCTOR DEVICE AND MANUFACTURING METHOD THEREOF

(71) Applicant: DB HiTek Co., Ltd., Bucheon-si (KR)

(72) Inventors: Ji Houn Jung, Seoul (KR); Dae Il Kim, Cheongju-si (KR); Han Seok Ko, Seoul (KR); Ung Bi Son, Bucheon-si (KR)

(73) Assignee: DB HiTek Co., Ltd., Bucheon-si (KR)

( * ) Notice: Subject to any disclaimer, the term of this patent is extended or adjusted under 35 U.S.C. 154(b) by 394 days.

(21) Appl. No.: 18/295,236

(22) Filed: Apr. 3, 2023

(65) Prior Publication Data

US 2024/0120386 A1   Apr. 11, 2024

(30) Foreign Application Priority Data

Oct. 7, 2022   (KR) .................. 10-2022-0128415

(51) Int. Cl.
*H10D 30/47* (2025.01)
*H10D 30/01* (2025.01)
*H10D 62/85* (2025.01)

(52) U.S. Cl.
CPC ....... *H10D 62/8503* (2025.01); *H10D 30/015* (2025.01); *H10D 30/475* (2025.01)

(58) Field of Classification Search
CPC .. H10D 30/471; H10D 30/472; H10D 30/473; H10D 30/4732; H10D 30/4735; H10D 30/4738; H10D 30/474; H10D 30/475; H10D 30/4755; H10D 30/476; H10D 30/477; H10D 30/478; H10D 30/47; H10D 30/015; H10D 64/115; H10D 64/112; H10D 64/117; H10D 64/111
See application file for complete search history.

(56) References Cited

U.S. PATENT DOCUMENTS

| | | | |
|---|---|---|---|
| 10,217,827 B2 | 2/2019 | Lee | |
| 10,833,159 B1* | 11/2020 | Hao | .......... H10D 30/4732 |
| 2011/0095336 A1* | 4/2011 | Zundel | ............ H10D 64/112 |
| | | | 257/E29.091 |
| 2013/0140578 A1* | 6/2013 | Yu | ............. H01L 21/0262 |
| | | | 257/E29.089 |
| 2017/0330940 A1 | 11/2017 | Lee | |
| 2018/0138306 A1* | 5/2018 | Jeon | ............ H10D 30/4755 |
| 2019/0229208 A1* | 7/2019 | Matioli | ............ H10D 30/47 |
| 2020/0259010 A1* | 8/2020 | Wu | ............ H10D 62/85 |
| 2023/0019799 A1* | 1/2023 | Park | ............ H10D 30/475 |
| 2024/0047529 A1* | 2/2024 | Lee | ............ H10D 30/015 |

FOREIGN PATENT DOCUMENTS

KR   20200068745 A   6/2020

* cited by examiner

*Primary Examiner* — Eric A. Ward
(74) *Attorney, Agent, or Firm* — Central California IP Group, P.C.; Andrew D. Fortney

(57) ABSTRACT

Disclosed is a power semiconductor device and a manufacturing method thereof and, more particularly, a power semiconductor device and a manufacturing method thereof seeking to capture electrons trapped on one side of a transistor during transistor operation, prevent current collapse effects, and improve reliability consequently by forming or including one or more hole injection regions in a separation space between a gate electrode and a drain electrode.

13 Claims, 5 Drawing Sheets

POWER SEMICONDUCTOR DEVICE AND MANUFACTURING METHOD THEREOF

CROSS REFERENCE TO RELATED APPLICATION

The present application claims priority to Korean Patent Application No. 10-2022-0128415, fled Oct. 7, 2022, the entire contents of which are incorporated herein for all purposes by this reference.

BACKGROUND OF THE INVENTION

Field of the Invention

The present disclosure relates to a power semiconductor device and a manufacturing method thereof and, more particularly, to a power semiconductor device and a manufacturing method thereof seeking to capture electrons trapped on one side of a transistor during transistor operation, prevent current collapse effects, and improve reliability by forming or including one or more hole injection regions in a separation space between a gate electrode and a drain electrode.

Description of the Related Art

Nitride semiconductors (e.g., Group III nitride materials) are being applied to high-voltage and high-power semiconductor devices due to their high electron saturation velocity and wide-bandgap (WBG) properties. Especially, gallium nitride (GaN) has a wider band gap and a higher breakdown voltage or electric field compared to silicon and gallium arsenide (GaAs), and thus shows excellent breakdown voltage characteristics when applied to transistors.

In addition, since gallium nitride (GaN)-based devices have higher electron mobility and electron saturation velocity compared to silicon-based devices that are currently commonly used, they may exhibit high frequency characteristics. When applied to a GaN device, the high electron mobility leads to improved on-resistance characteristics, and thus allows for the implementation of a low-loss switching device.

As such, GaN-based field effect transistors (FETs) have great advantages as devices that are suitable for high frequency and high power applications, and for this reason, continuous research is being conducted thereon. Although much progress has been made in the research and development of GaN-based FETs over the past few years, there are still several issues that need to be addressed regarding device reliability. One of the important issues is related to current collapse effects caused by traps in the semiconductor.

FIG. 1 is a partial cross-sectional view of a conventional GaN power semiconductor device.

Hereinafter, the schematic structure and problems of a conventional GaN power semiconductor device 9 will be described in detail with reference to the accompanying FIG. 1.

Referring to FIG. 1, in the conventional GaN power semiconductor device 9, a higher voltage than the voltage applied to the source electrode 910 and the gate electrode 930 may be applied to the drain electrode 950. In this case, carriers may be trapped between the gate electrode 930 and the drain electrode 950. Due to the carrier trapping, current collapse may occur, and this current collapse may cause a "memory effect" in which the conduction current of the device 9 may vary, depending on how long the previous voltage(s) were applied. For example, during transistor operation, electrons trapped in the epitaxial layer 920, a dielectric layer (either not shown or not identified in FIG. 1), or at an interface between the epitaxial layer 920 and the dielectric layer may repel electrons traveling through the channel of the device 9, impeding current conduction through a two-dimensional electron gas (2DEG) layer 970 in the device 9. This may immediately increase the resistance of the channel.

To solve the above-mentioned problems, the present disclosure concerns a novel power semiconductor device with an improved structure and a manufacturing method thereof.

DOCUMENTS OF RELATED ART

Korean Patent Application Publication No. 10-2020-0068745, entitled "HIGH ELECTRON MOBILITY TRANSISTOR."

SUMMARY OF THE INVENTION

The present disclosure has been made to solve the problems of the related art, and an objective of the present disclosure is to provide a power semiconductor device and a manufacturing method thereof seeking to prevent current collapse between a gate electrode and a drain electrode by forming or including one or more hole injection regions on a barrier layer in contact with or adjacent to the drain electrode.

An objective of the present disclosure is to provide a power semiconductor device and a manufacturing method thereof seeking to increase process efficiency by regularly and repeatedly forming a plurality of relatively short and relatively long hole injection regions along a second direction.

An objective of the present disclosure is to provide a power semiconductor device and a manufacturing method thereof seeking to enable easy manufacturing by forming a hole injection region substantially simultaneously with a capping layer (e.g., in the same process[es]).

According to an embodiment of the present disclosure, there is provided a power semiconductor device, including a substrate; a channel layer on the substrate; a barrier layer on the channel layer; a capping layer having a first conductivity type on the barrier layer; a gate electrode on the capping layer; a source electrode and a drain electrode spaced apart from the gate electrode (e.g., comprising ohmic contact regions) on the barrier layer; a hole injection region having the first conductivity type between the gate electrode and the drain electrode on the barrier layer; and an insulating film on the barrier layer.

According to another embodiment of the present disclosure, the power semiconductor device may comprise a plurality of hole injection regions spaced apart along a second direction on the barrier layer.

According to still another embodiment of the present disclosure, in the power semiconductor device, any one of the plurality of hole injection regions may have a length in a first direction that is different from the other hole injection regions.

According to still another embodiment of the present disclosure, in the power semiconductor device, the plurality of hole injection regions may have lengths different from each other in the first direction.

According to still another embodiment of the present disclosure, in the power semiconductor device, adjacent ones of the plurality of hole injection regions may have different separation distances from each other along the second direction.

According to still another embodiment of the present disclosure, there is provided a power semiconductor device, including a substrate; a channel layer comprising a first nitride-based (e.g., GaN) semiconductor layer on the substrate; a barrier layer on the channel layer, comprising a second nitride-based semiconductor layer different from the first nitride-based semiconductor layer; a capping layer having a first conductivity type, on the barrier layer; a gate electrode on the capping layer; a source electrode and a drain electrode on the barrier layer, spaced apart from the gate electrode (e.g., comprising ohmic contact regions); a plurality of hole injection regions having the first conductivity type, between the gate electrode and the drain electrode, and on the barrier layer; and an insulating film (which may be on the gate electrode) on the barrier layer, wherein the plurality of hole injection regions may be in contact with the drain electrode (or a lowermost surface thereof).

According to still another embodiment of the present disclosure, the power semiconductor device may further include an island region having the first conductivity type, spaced apart from the drain electrode and between the gate electrode and the drain electrode.

According to still another embodiment of the present disclosure, in the power semiconductor device, the island region may be spaced apart from the hole injection regions.

According to still another embodiment of the present disclosure, in the power semiconductor device, the hole injection regions along a second direction may decrease in length in a first direction.

According to still another embodiment of the present disclosure, in the power semiconductor device, the hole injection regions may include a first region; a second region adjacent to the first region along the second direction; a third region adjacent to the second region along the second direction; and a fourth region adjacent to the third region along the second direction, wherein a width of the second region in the first direction may be less than half of that of the first region, a width of the third region in the first direction may be less than half of that of the second region, and a width of the fourth region in the first direction may be less than half of that of the third region.

According to still another embodiment of the present disclosure, there is provided a power semiconductor device, including a substrate; a channel layer comprising a first nitride-based semiconductor layer (e.g., GaN) on the substrate; a barrier layer on the channel layer, comprising a second nitride-based semiconductor layer different from the first nitride-based semiconductor layer; a capping layer having a first conductivity type on the barrier layer; a gate electrode on the capping layer; a source electrode and a drain electrode on the barrier layer, spaced apart from the gate electrode (and, e.g., comprising ohmic contact regions); and a plurality of hole injection regions on the barrier layer, having the first conductivity type, and being spaced apart from the gate electrode and in contact with the drain electrode (or a lowermost surface thereof), wherein the hole injection regions may be spaced apart from each other along a second direction and may have different widths in a first direction.

According to still another embodiment of the present disclosure, the power semiconductor device may further include a buffer layer between the substrate and the channel layer.

According to still another embodiment of the present disclosure, in the power semiconductor device, a separation distance between adjacent ones of the hole injection regions may be substantially identical or the same.

According to still another embodiment of the present disclosure, in the power semiconductor device, the hole injection regions may have a plurality of separation distances in the second direction.

According to still another embodiment of the present disclosure, in the power semiconductor device, along the second direction, the hole injection regions may have a shorter or longer length in the first direction.

According to an embodiment of the present disclosure, there is provided a method of manufacturing a power semiconductor device, the method including forming a buffer layer on a substrate; forming a channel layer comprising a first nitride-based semiconductor layer such as GaN on the buffer layer; forming a barrier layer comprising a second nitride-based semiconductor layer such as AlGaN on the channel layer; forming a capping layer having a first conductivity type on the barrier layer; forming a plurality of hole injection regions having the first conductivity type on the barrier layer; forming a source electrode on the barrier layer; forming a drain electrode spaced apart from the source electrode on the barrier layer; forming a gate electrode on the capping layer; and forming an insulating film on the gate electrode.

According to another embodiment of the present disclosure, in the method of manufacturing a power semiconductor device, the hole injection regions may be formed substantially simultaneously with the capping layer (e.g., in the same process[es]).

According to still another embodiment of the present disclosure, the method of manufacturing a power semiconductor device may further include forming an island region spaced apart from the drain electrode and the hole injection regions.

According to still another embodiment of the present disclosure, in the method of manufacturing a power semiconductor device, hole injection regions may have a plurality of lengths in a first direction.

The present disclosure has the following effects by the above configurations.

According to the present disclosure, by forming or including one or more hole injection regions on a barrier layer in contact with or adjacent to a drain electrode, it is possible to prevent current collapse between the gate electrode and the drain electrode.

In addition, according to the present disclosure, by forming or including a plurality of regular and/or repeated short and long hole injection regions along the second direction, it is possible to increase process efficiency.

Furthermore, according to the present disclosure, by forming or including a hole injection region substantially simultaneously with a capping layer (e.g., in the same process[es]), it is possible to enable easy manufacturing.

Meanwhile, it should be added that even if effects are not explicitly mentioned herein, the effects described in the following specification expected by the technical features of the present disclosure and their potential effects are treated as if they were described in the present specification.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Hereinafter, embodiments of the present disclosure will be described in more detail with reference to the accompanying drawings. The embodiments of the present disclosure may be modified in various forms, and the scope of the present disclosure should not be construed as being limited to the following embodiments, but should be construed based on the matters described in the claims. In addition, these embodiments are provided for reference in order to more completely explain the present disclosure to those skilled in the art.

As used herein, the singular form may include the plural form, unless the context clearly indicates otherwise. In addition, as used herein, the terms "comprise" and/or "comprising" specify the presence of the recited shapes, numbers, steps, operations, members, elements, and/or groups thereof, but do not exclude the presence or addition of one or more other shapes, numbers, steps, operations, members, elements, and/or groups thereof.

Hereinafter, it should be noted that when one component (or layer) is described as being on another component (or layer), the one component (or layer) may be directly on the other component (or layer), or one or more additional components or layers may be between the one component (or layer) and the other component (or layer). In addition, when one component is expressed as being directly on or above another component, no other components are between the one component and the other component. Moreover, being on "top", "upper", "lower", "above", "bottom" or "one (first) side" or "opposite side" of a component means a relative positional relationship.

Meanwhile, it should be noted that, where certain embodiments are otherwise feasible, certain process sequences may be performed other than those described below. For example, two processes described in succession may be performed substantially simultaneously or in the reverse order.

Hereinafter, a region having a "first conductivity type" may refer to a P-type doping region, for example, and a region having a "second conductivity type" may refer to an N-type doping region.

Furthermore, hereinafter, a direction in which a gate electrode and an adjacent drain are spaced apart from each other will be described as a "first direction", and a direction orthogonal to the first direction on the horizontal plane will be described as a "second direction". That is, in the plan view of FIG. 2, an x-axis direction is the first direction, and a y-axis direction is the second direction.

Figure 2:
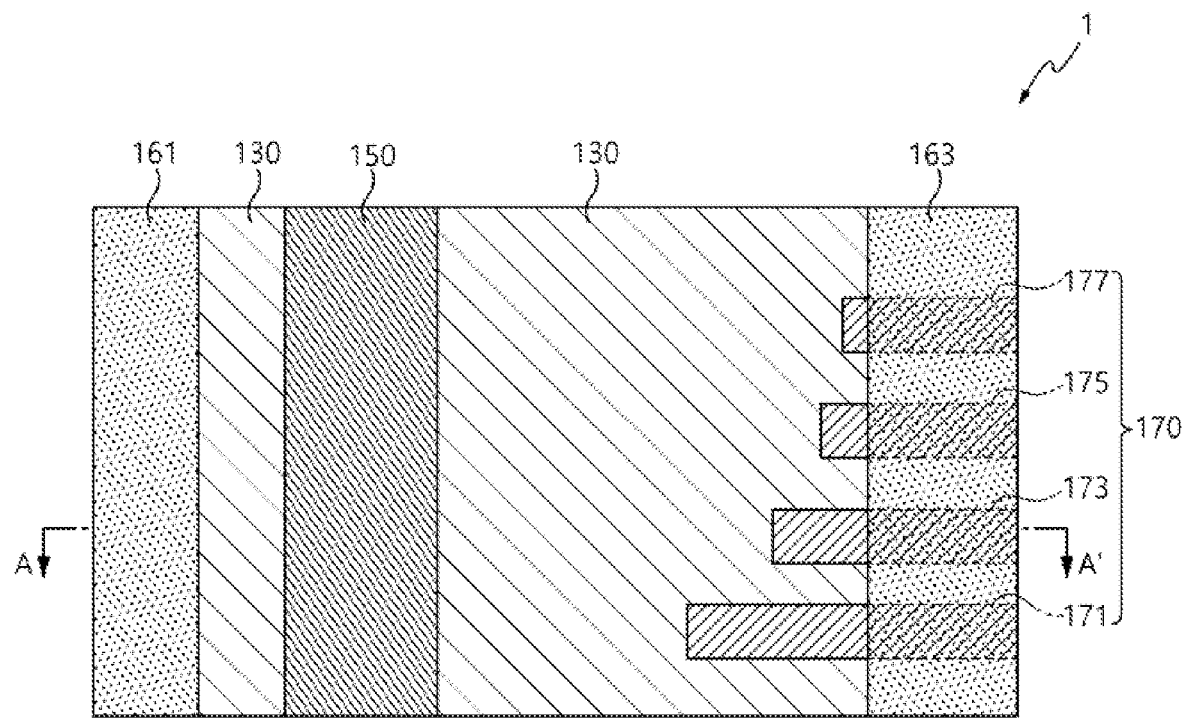
FIG. 2 is a plan view of a power semiconductor device according to an embodiment of the present disclosure.
Figure 3:
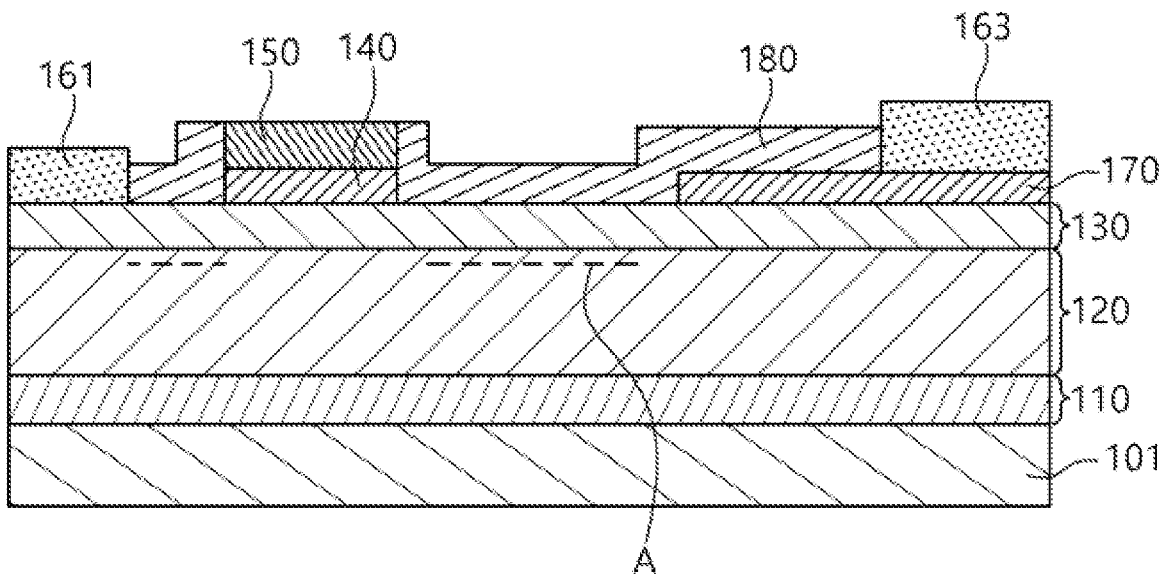
FIG. 3 is a cross-sectional view of the power semiconductor device of FIG. 2 taken along the line A-A'.

FIG. 2 is a plan view of a power semiconductor device according to an embodiment of the present disclosure, and FIG. 3 is a cross-sectional view of the power semiconductor device of FIG. 2 taken along the line A-A'. For convenience of explanation, the configuration of an insulating film is omitted in FIG. 2.

Hereinafter, a power semiconductor device 1 according to an embodiment of the present disclosure will be described in detail with reference to the accompanying drawings.

Referring to FIGS. 2 and 3, the present disclosure relates to a power semiconductor device 1 and a manufacturing method thereof and, more particularly, to a power semiconductor device 1 and a manufacturing method thereof seeking to capture electrons trapped on one side of a transistor during transistor operation, prevent current collapse, and improve reliability consequently by forming or including one or more hole injection regions in the separation space between a gate electrode and a drain electrode.

The power semiconductor device 1 may include a substrate 101, a buffer layer 110, a channel layer 120, a barrier layer 130, a capping layer 140, a gate electrode 150, a source electrode 161, a drain electrode 163, a hole injection region 170, and an insulating film 180.

The substrate 101 is a substrate allowing for growth of an epitaxial layer thereon, and may comprise, for example, a single-crystal silicon substrate, but is not limited thereto, and may be, for example, a sapphire substrate, a GaN substrate, or a SiC substrate. In an example of the present disclosure, the substrate 101 is a silicon substrate.

The buffer layer 110 is a layer on the substrate 101, and may be formed, for example, by growing AlN (e.g., epitaxial AlN) on the substrate 101 to a predetermined thickness. Alternatively, the buffer layer 110 may comprise one or more composite layers of GaN and AlGaN, but is not limited thereto. The buffer layer 110 may have a structure preventing stress caused by differences in lattice constants and/or thermal expansion coefficients between the substrate 101 and the channel layer 120 to be described later. The buffer layer 110 may be doped with impurities such as C and/or Fe.

The channel layer 120 is on the substrate 101, more preferably on the buffer layer 110, and may comprise, for example, a first Group III nitride-based semiconductor layer such as GaN. The barrier layer 130 is on the channel layer 120 and may comprise, for example, a second Group III nitride-based semiconductor layer such as AlGaN. The channel layer 120 and the barrier layer 130 preferably comprise different nitride-based semiconductor layers. With such a structure, a two-dimensional electron gas (2DEG) layer A may form near the interface between the channel layer 120 and the barrier layer 130 (e.g., when the device 1 conducts electrons). The density and mobility of the 2DEG layer A may be controlled by adjusting the content of Al and Ga in the barrier layer 130. The 2DEG layer A may be formed in the channel layer 120. A channel region having a predetermined thickness may form in the channel layer 120 and near the interface with the barrier layer 130. That is, the channel region may not form in or across the entire channel layer 120.

An etch stop layer (not shown) may be on the upper surface of the barrier layer 130. The etch stop layer may comprise an epitaxial AlN layer.

The capping layer 140 is below the gate electrode 150 and/or on the barrier layer 130 or the etch stop layer, and comprises, for example, a first conductivity type doped region (e.g., P-doped silicon), and preferably has a positive polarity. The capping layer 140 has an appropriate thickness, for example, preferably in a range of 10 nm to 1000 nm, but is not limited thereto. This is because when the capping layer 140 has greater than a predetermined thickness (e.g., >1000 nm), the distance from the gate electrode 150 to the 2DEG layer A increases, resulting in a decrease in response speed. On the contrary, when the capping layer 140 has less than a predetermined thickness (e.g., <10 nm), it is difficult to turn off the device 1. The capping layer 140 may comprise p-GaN, for example, epitaxial GaN doped with Mg.

The capping layer 140 is substantially under only the gate electrode 150, and the 2DEG layer A does not exist below the capping layer 140 during non-operation. Thus, the 2DEG layer A does not exist in the channel layer 120 when the gate voltage is off, and when the gate voltage is turned on, the 2DEG layer A forms and the device may be driven (e.g., may conduct carriers, such as electrons).

The gate electrode 150 is on or over the barrier layer 130, for example, on the capping layer 140, and may comprise, for example, a single layer or a composite layer of various types of metals such as Ti and Pd. In addition, when the gate voltage is off, a depletion layer may pass through the barrier layer 130 to reach the channel layer 120 and block the 2DEG layer A.

The source electrode 161 and the drain electrode 163 are spaced apart from the gate electrode 150 and may comprise ohmic contact regions on the barrier layer 130. It should be noted that the source electrode 161 and the drain electrode 163 may have, for example, a stepped cross-sectional shape or a rectangular cross-sectional shape, but may also various other shapes and/or structures. As an example, the source electrode 161, the gate electrode 150, and the drain electrode 163 may be sequentially spaced apart from each other along a horizontal direction. In addition, the source electrode 161 and the drain electrode 163 may comprise, for example, a single layer or a composite layer of various arbitrary metals capable of ohmic contact, such as Ti, Au, and Al, and there is no particular limitation thereon.

Hereinafter, problems of a conventional power semiconductor device 9 will be described in detail prior to describing the characteristics of the present disclosure.

Figure 1:
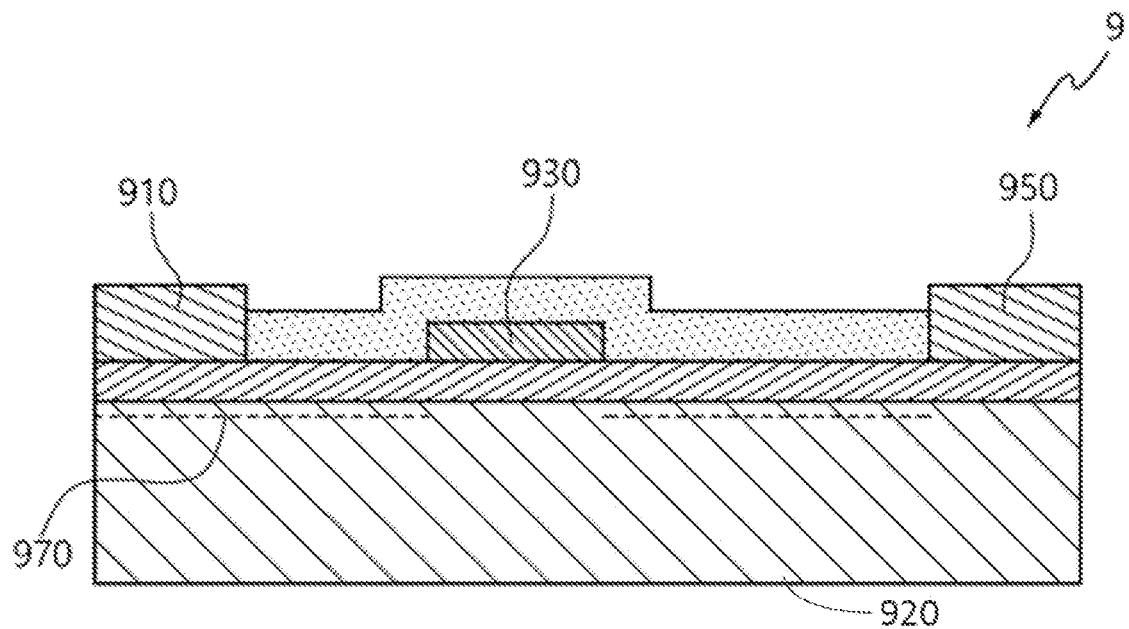
FIG. 1 is a partial cross-sectional view of a conventional power semiconductor device.

Referring to FIG. 1, in the conventional GaN power semiconductor device 9, a higher voltage than the voltage applied to the source electrode 910 and the gate electrode 930 may be applied to the drain electrode 950. In this case, carriers may be trapped between the gate electrode 930 and the drain electrode 950. Due to the carrier trapping, current collapse may occur, and this current collapse may cause a "memory effect" in which the conduction current of the device 9 may vary, depending on how long the previous voltage(s) were applied. For example, during transistor operation, electrons trapped in the epitaxial layer 920, a dielectric layer (either not shown or not identified in FIG. 1), or at an interface between the epitaxial layer 920 and the dielectric layer may repel electrons traveling through the channel of the device 9, making current conduction through a 2DEG layer 970 in the device 9 difficult. This may immediately increase the resistance of the channel.

To solve the above-mentioned problems, referring to FIGS. 2 and 3, in the power semiconductor device 1 according to an embodiment of the present disclosure, the hole injection region 170 is on the barrier layer 130 or the etch stop layer. The hole injection region 170 has the first conductivity type, in which holes are supplied to capture trapped electrons adjacent to the barrier layer 130. In addition, the hole injection region 170 may be adjacent to the drain electrode 163 or in contact with the drain electrode 163. For example, the hole injection region 170 may be in contact with the drain electrode 163 (or a lowermost surface thereof). That is, the drain electrode 163 may be on the hole injection region 170. The hole injection region 170 may include an island region (not shown) that does not contact the drain electrode 163 on the barrier layer 130. The island region may not overlap with another hole injection region 170 along the first direction, but is not limited thereto.

The hole injection region 170 may comprise epitaxially-grown p-GaN. For example, it may comprise GaN doped with Mg, and may be formed at substantially the same time as the aforementioned capping layer 140 in substantially the same process(es), but is not limited thereto.

Preferably, at least part of one hole injection region 170 is in a space between the gate electrode 150 and the adjacent drain electrode 163, and more preferably, at least part of each of a plurality of hole injection regions 170 are between the gate electrode 150 and the adjacent drain electrode 163. For example, a plurality of hole injection regions 170 connected to the drain electrode 163 and spaced apart from each other in the second direction. The separation distance in the second direction between adjacent ones of the plurality of hole injection regions 170 may be substantially the same or may be different from each other, but is not limited thereto.

In addition, at least one of the plurality of hole injection regions 170 may extend along the first direction (e.g., into the space between the gate electrode 150 and the adjacent drain electrode 163) a different length from the other injection regions 170. Accordingly, the plurality of hole injection regions 170 may have different lengths in the first direction. That is, one or more of the individual regions 170 may have a length different from the other regions 170 along the first direction, but there is no particular limitation thereto.

Furthermore, the plurality of hole injection regions 170 may have lengths in the first direction that increase or decrease along the second direction. That is, the plurality of hole injection regions 170 may have lengths in the first direction that regularly decrease or increase as a function of distance along the second direction.

For example, relative to the longest hole injection region (referred to as a first region 171), the length that the adjacent hole injection region (referred to as a second region 173) extends in the first direction into the space between the gate electrode 150 and the adjacent drain electrode 163 may be from 0.4 times to 0.5 times that of the first region 171. In addition, the length that the hole injection region adjacent to the second region 173 (referred to as a third region 175) extends in the first direction into the space between the gate electrode 150 and the adjacent drain electrode 163 may be from 0.2 times to 0.25 times that of the first region 171, and the length that the hole injection region adjacent to the third region 175 (referred to as a fourth region 177) extends in the first direction into the space between the gate electrode 150 and the adjacent drain electrode 163 may be from 0.10 times to 0.125 times that of the first region 171. Conversely, the fourth region 177 may have the longest extension length in the first direction into the space between the gate electrode 150 and the adjacent drain electrode 163, while the first region 171 may have the shortest extension length in the first direction into the space between the gate electrode 150 and the adjacent drain electrode 163, but there is no particular limitation thereto.

By injecting holes into the channel from the hole injection regions 170 as described above, the holes combine with the trapped electrons to lower the electrical resistance of the device 1, thereby minimizing the memory effect.

The insulating film 180 is, for example, a gate insulating film and comprises a material having electrical insulating properties. The insulating film 180 may be on the barrier layer 130 and cover sidewalls of the gate electrode 150, and may also cover parts of the hole injection region 170 otherwise exposed or uncovered by the drain electrode 163. In addition, the insulating film 180 may not cover the source electrode 161 and the drain electrode 163. The insulating film 180 may have one or more openings for the source electrode 161 and the drain electrode 163, and may comprise $Al_2O_3$ and be on the barrier layer 130, the gate electrode 150, the hole injection region 170, the source electrode 161 and the drain electrode 163. Details on this will be described in the manufacturing method below.

FIGS. 4 to 11 are cross-sectional views showing structures formed during a method of manufacturing a power semiconductor device according to one or more embodiments of the present disclosure.

Hereinafter, the method of manufacturing a power semiconductor device according to embodiments of the present disclosure will be described in detail with reference to the accompanying drawings.

Figure 4:
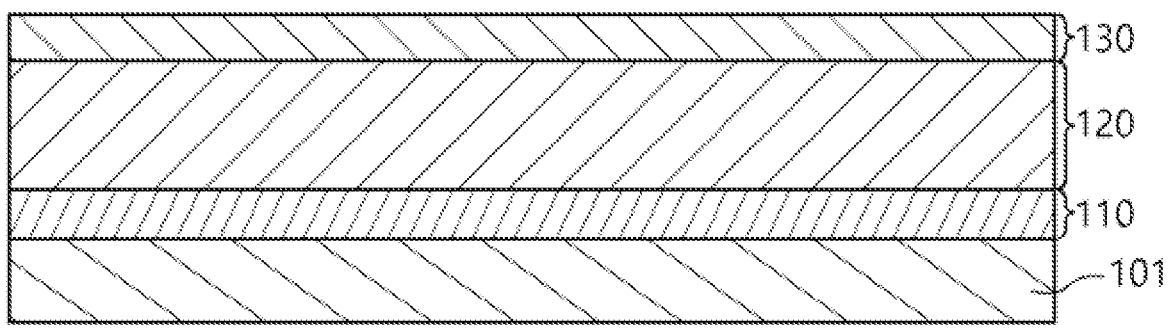
FIGS. 4 to 11 are cross-sectional views showing structures formed during a method of manufacturing a power semiconductor device according to one or more embodiments of the present disclosure.
Figure 5:
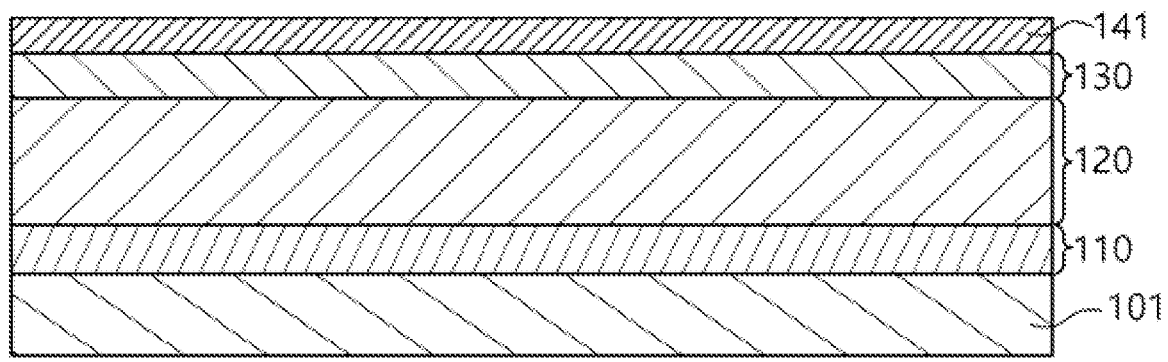
Figure 6:
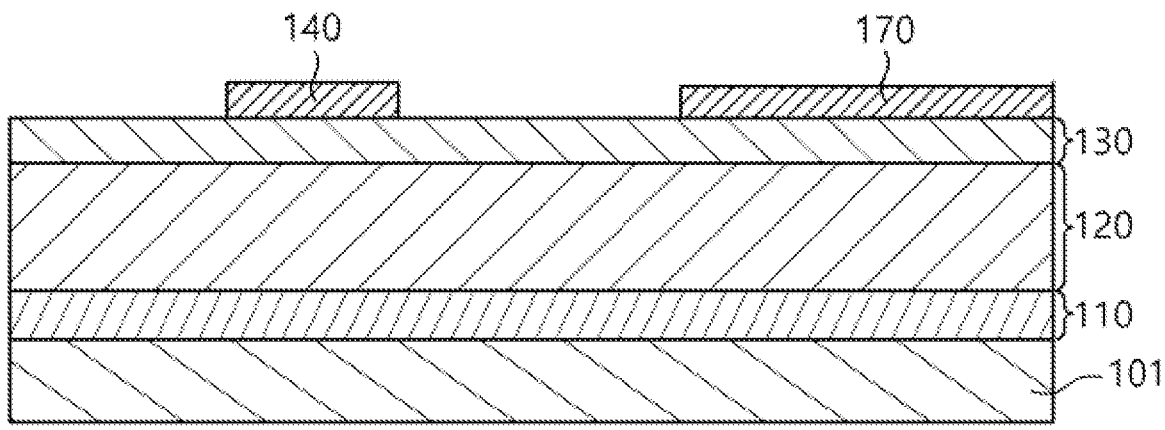

First, referring to FIG. 4, a buffer layer 110, a channel layer 120, and a barrier layer 130 are sequentially formed on a substrate 101. As previously described, the substrate 101 is a substrate on which an epitaxial layer can be grown, and may comprise, a single-crystal silicon substrate, a sapphire substrate, a GaN substrate, or a SiC substrate. In the present disclosure, a silicon substrate will be described as an example. The buffer layer 110 may be formed on the substrate 101 by epitaxially growing, for example, an AlN layer to a predetermined thickness.

The channel layer 120 comprises a Group III nitride-based semiconductor layer such as GaN, and is formed on the buffer layer 110 by epitaxial growth. The barrier layer 130 comprises a Group III nitride-based semiconductor layer such as AlGaN, and is formed on the channel layer 120 by epitaxial growth. A 2DEG layer (not shown) may formed at the interface between the channel layer 120 and the barrier layer 130. To be specific, piezoelectric polarization may occur at the interface between the channel layer 120 and the barrier layer 130 due to a difference in lattice constants between GaN and AlGaN. The combined effects of piezoelectric and spontaneous polarization of the channel layer 120 and the barrier layer 130 may result in generating a two-dimensional electron gas with a high electron concentration at the interface of the channel layer 120 and the barrier layer 130.

Next, the capping layer 140 may be formed on the barrier layer 130. The capping layer 140 may be formed by growing p-GaN epitaxially to a predetermined thickness. For example, when GaN has the first conductivity type like the barrier layer 130, Mg may be added to GaN source gasses (e.g., bis-cyclopentadienylmagnesium may be added to ammonia and trimethylgallium) to dope GaN with Mg. In addition, a gate electrode 150 may be formed on the capping layer 140. The capping layer 140 is preferably formed substantially simultaneously with the hole injection region(s) 170.

The process for forming the capping layer 140 and the hole injection region(s) 170 will be described as an example. A doped layer 141 comprising first conductivity type GaN is formed on the barrier layer 130 (see FIG. 5), for example, by metalorganic chemical vapor deposition (MOCVD) or electron beam epitaxy. Then, the hole injection region(s) 170 may be formed together with the capping layer 140 by etching the doped layer 141 using a mask pattern (not shown) (see FIG. 6).

Figure 7:
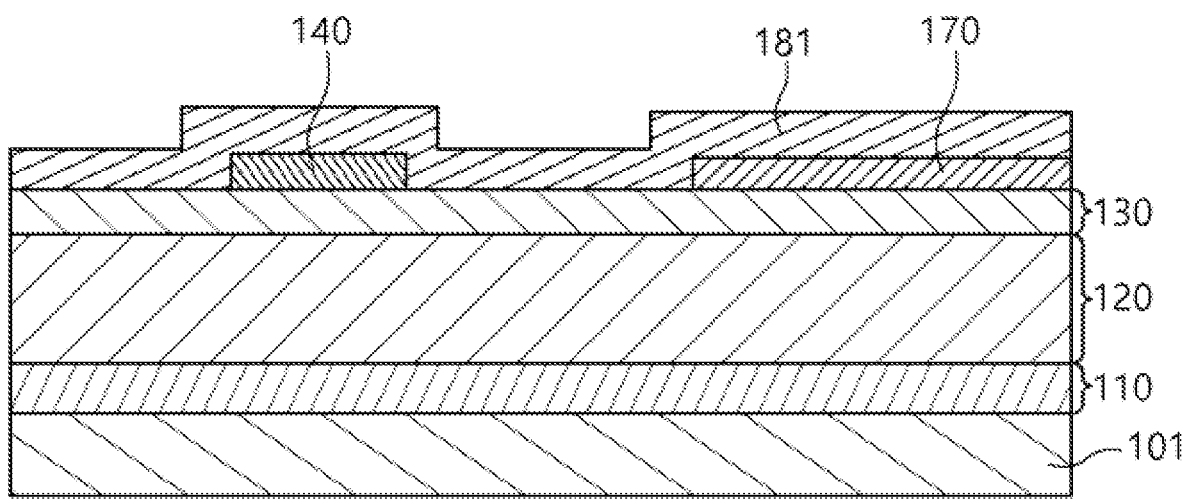

Thereafter, referring to FIG. 7, an insulating film or layer 181 is formed on the barrier layer 130 to cover the capping layer 140 and the hole injection region 170. The insulating film or layer 181 may be formed by blanket-depositing $Al_2O_3$, for example.

Figure 8:
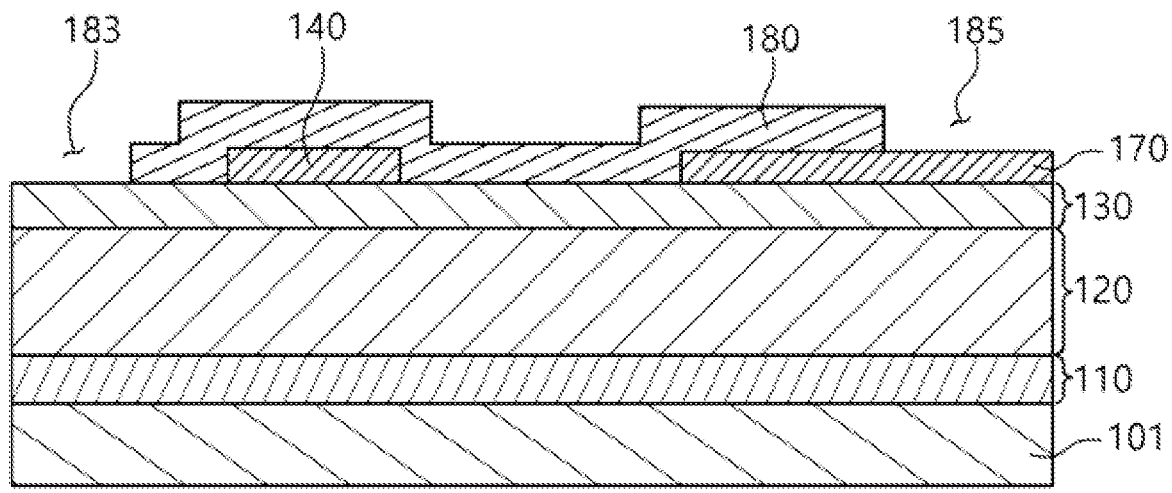
Figure 9:
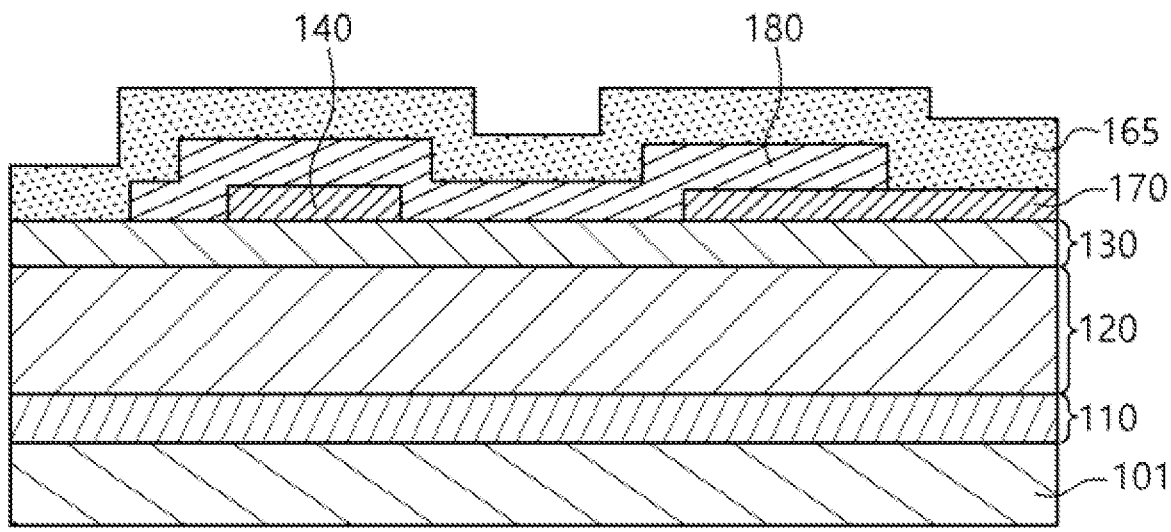
Figure 10:
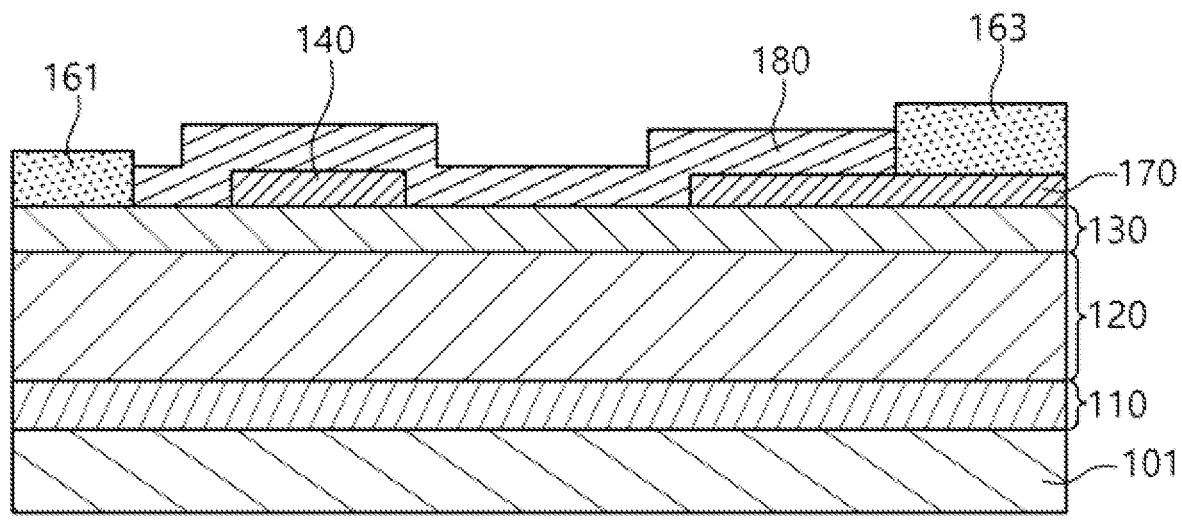

Subsequently, referring to FIG. 8, after the insulating film or layer 181 is formed, openings 183 and 185 are formed at positions where the source electrode 161 and the drain electrode 163 are to be formed. The openings 183 and 185 may be formed by forming a mask pattern (not shown) on the insulating film layer 181 and then etching the insulating film layer 181 exposed by the mask pattern.

Thereafter, the source electrode 161 and the drain electrode 163 are formed. The source electrode 161 may be formed on the barrier layer 130, and at least a part of the drain electrode 163 may be formed on the hole injection region(s) 170 or in contact with the hole injection region(s) 170, but is not limited thereto.

The process of forming the source electrode 161 and the drain electrode 163 will be described in detail. After depositing a metal layer 165 on the insulating film 180 and filling the openings 183 and 185, a mask pattern (not shown) is conventionally formed on the metal layer 165 (see FIG. 9). The metal layer 165 is partially removed by conventional etching using the mask pattern. As a result, the source electrode 161 and the drain electrode 163 may be formed (see FIG. 10).

Figure 11:
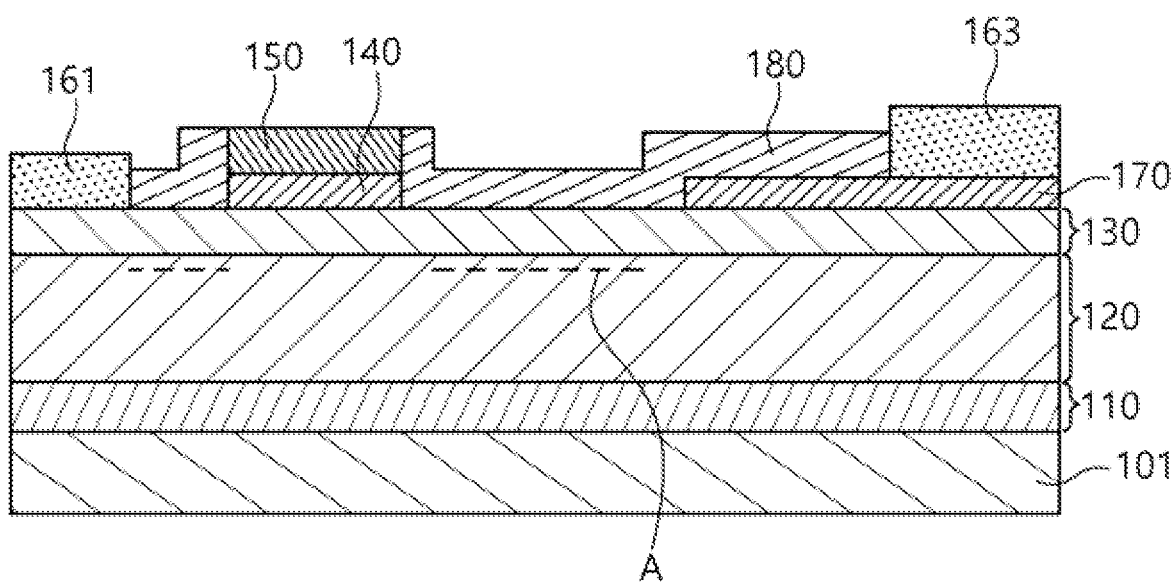

Referring to FIG. 11, a gate electrode 150 is formed in a subsequent process. To form the gate electrode 150, an additional insulating film or layer (not shown) is formed on the insulating film layer 181 (e.g., by blanket deposition), and an opening (not shown) is formed in the additional insulating film or layer. The opening may be at a position exposing the capping layer 140. Thereafter, a metal layer (not shown) may be formed on the additional insulating film or layer (or, alternatively, on the source electrode 161 and the drain electrode 163) to fill the opening, and the gate electrode 150 may be formed by removing the metal layer outside of the opening (e.g., by chemical mechanical polishing or conventional etchback).

The above detailed description is illustrative of the present disclosure. In addition, the above description shows and describes various embodiments of the present disclosure, and the present disclosure can be used in various other combinations, modifications, and environments. That is, changes or modifications are possible within the scope of the concept of the disclosure herein, the scope equivalent to the written disclosure, and/or within the scope of skill or knowledge in the art. The above-described embodiments describe various states for implementing the technical idea of the present disclosure, and various changes for specific applications and/or fields of use of the present disclosure are possible. Accordingly, the detailed description of the present disclosure is not intended to limit the present disclosure to the disclosed embodiments.

What is claimed is:

1. A power semiconductor device, comprising:
   a substrate;
   a channel layer on the substrate;
   a barrier layer on the channel layer;
   a capping layer having a first conductivity type on the barrier layer;
   a gate electrode on the capping layer;
   a source electrode and a drain electrode spaced apart from the gate electrode and on the barrier layer, wherein the gate electrode and the drain electrode are spaced apart from each other in a first direction in a horizontal plane;
   a plurality of hole injection regions having a line shape and the first conductivity type, between the gate electrode and the drain electrode on the barrier layer, and spaced apart along a second direction orthogonal to the first direction in the horizontal plane; and an insulating film on the barrier layer, wherein:
each hole injection region has an uppermost surface in contact with a lowermost surface of the drain electrode,
the plurality of hole injection regions along the second direction decrease in length in the first direction and have sides that overlap with each other in the second direction, and
the plurality of hole injection regions have respective end portions below the drain electrode, aligned on a common axis parallel to the second direction.

2. The power semiconductor device of claim 1, wherein the plurality of hole injection regions comprise:
a first region;
a second region adjacent to the first region along the second direction;
a third region adjacent to the second region along the second direction; and
a fourth region adjacent to the third region along the second direction.

3. The power semiconductor device of claim 1, further comprising:
a buffer layer between the substrate and the channel layer.

4. The power semiconductor device of claim 1, wherein a separation distance between adjacent ones of the plurality of hole injection regions is substantially the same.

5. The power semiconductor device of claim 1, wherein the plurality of hole injection regions have a plurality of separation distances in the second direction.

6. The power semiconductor device of claim 1, wherein the common axis is in the second direction.

7. The power semiconductor device of claim 1, wherein the line shape is rectangular.

8. The power semiconductor device of claim 1, wherein the plurality of hole injection regions have lengths in the first direction that regularly decrease as a function of distance along the second direction.

9. A method of manufacturing a power semiconductor device, the method comprising:
forming a buffer layer on a substrate;
forming a channel layer comprising a first nitride-based semiconductor layer on the buffer layer;
forming a barrier layer comprising a second nitride-based semiconductor layer on the channel layer;
forming a capping layer having a first conductivity type on the barrier layer;
forming a plurality of hole injection regions having a line shape and the first conductivity type on the barrier layer;
forming a source electrode on the barrier layer, the drain electrode having a lowermost surface in contact with an uppermost surface of each hole injection region;
forming a drain electrode spaced apart from the source electrode on the barrier layer;
forming a gate electrode on the capping layer, wherein the gate electrode and the drain electrode are spaced apart from each other in a first direction in a horizontal plane; and
forming an insulating film on the gate electrode, wherein:
the plurality of hole injection regions are spaced apart along a second direction orthogonal to the first direction in the horizontal plane;
the plurality of hole injection regions along the second direction decrease in length in the first direction and have sides that overlap with each other in the second direction, and
respective end portions of the plurality of hole injection regions below the drain electrode are aligned on a common axis parallel to the second direction.

10. The method of claim 9, wherein the plurality of hole injection regions are formed substantially simultaneously with the capping layer.

11. The method of claim 9, wherein the common axis is in the second direction.

12. The method of claim 9, wherein the line shape is rectangular.

13. The method of claim 9, wherein the plurality of hole injection regions have lengths in the first direction that regularly decrease as a function of distance along the second direction.

* * * * *